United States Patent
Ohbayashi et al.

(10) Patent No.: US 8,759,861 B2
(45) Date of Patent: Jun. 24, 2014

(54) LED DEVICE WITH CERIUM OXIDE DISPERSION LAYER AND METHOD FOR MANUFACTURING SAME

(71) Applicant: Panasonic Corporation, Kadoma (JP)

(72) Inventors: Takashi Ohbayashi, Osaka (JP); Seigo Shiraishi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/692,797

(22) Filed: Dec. 3, 2012

(65) Prior Publication Data

US 2013/0092967 A1   Apr. 18, 2013

Related U.S. Application Data

(63) Continuation of application No. PCT/JP2011/007003, filed on Dec. 15, 2011.

(30) Foreign Application Priority Data

Dec. 17, 2010   (JP) ................ 2010-281591

(51) Int. Cl.
*H01L 33/44* (2010.01)
*H01L 33/00* (2010.01)

(52) U.S. Cl.
USPC ............................. 257/98; 438/26

(58) Field of Classification Search
CPC ......... H01L 33/44; H01L 33/00; H01L 33/56; H01L 33/005; H01L 2933/005
USPC ............................................. 257/98; 438/26
See application file for complete search history.

(56) References Cited

U.S. PATENT DOCUMENTS

| 4,025,485 A | 5/1977 | Kodama et al. |
| 6,239,205 B1 | 5/2001 | Hasegawa et al. |
| 7,658,866 B2 * | 2/2010 | Murazaki et al. ...... 252/301.4 R |
| 2004/0135504 A1 * | 7/2004 | Tamaki et al. ................ 313/512 |
| 2007/0228390 A1 * | 10/2007 | Hattori et al. .................. 257/79 |
| 2008/0031009 A1 | 2/2008 | Kodaira et al. |
| 2009/0140284 A1 | 6/2009 | Kurino et al. |
| 2009/0256166 A1 | 10/2009 | Koike et al. |
| 2010/0104842 A1 * | 4/2010 | Suzuki et al. ................ 428/220 |
| 2010/0254153 A1 | 10/2010 | Hama et al. |

FOREIGN PATENT DOCUMENTS

| JP | 52-14654 | 2/1977 |
| JP | 2000-212444 A | 8/2000 |
| JP | 2002-161168 A | 6/2002 |
| JP | 2006-196282 A | 7/2006 |

(Continued)

OTHER PUBLICATIONS

International Search Report issued in International Patent Application No. PCT/JP2011/007003 dated Feb. 7, 2012.

*Primary Examiner* — Walter H Swanson
(74) *Attorney, Agent, or Firm* — McDermott Will & Emery LLP

(57) ABSTRACT

An LED device includes: a substrate; an LED element provided on the substrate; a cerium oxide-dispersed composition layer containing a silicone resin and cerium oxide in an amount of 0.005 parts by weight or more and 0.03 parts by weight or less with respect to 100 parts by weight of the silicone resin, for covering the LED element; and a sealing material containing no cerium oxide for covering the cerium oxide-dispersed composition layer.

6 Claims, 5 Drawing Sheets

(56) References Cited

FOREIGN PATENT DOCUMENTS

| | | |
|---|---|---|
| JP | 2007-227530 A | 9/2007 |
| JP | 2007-299981 A | 11/2007 |
| JP | 2008-166512 A | 7/2008 |
| JP | 2009-170825 A | 7/2009 |
| JP | 2010-004034 A | 1/2010 |
| JP | 2010-232203 A | 10/2010 |
| WO | WO-2006/038502 A1 | 4/2006 |
| WO | WO-2007/018039 A1 | 2/2007 |

\* cited by examiner

LED DEVICE WITH CERIUM OXIDE DISPERSION LAYER AND METHOD FOR MANUFACTURING SAME

This is a continuation of International Application No. PCT/JP2011/007003, with an international filing date of Dec. 15, 2011, which claims priority of Japanese Patent Application No. 2010-281591, filed on Dec. 17, 2010, the contents of which are hereby incorporated by reference.

TECHNICAL FIELD

The present invention relates to an LED device in which a cerium oxide-dispersed composition with cerium oxide dispersed therein is provided on a surface of an LED element, and a method for manufacturing the LED device.

BACKGROUND ART

High luminance and long life have been desired as recent LED lighting, and for sealing resin materials for sealing LEDs, high heat-resistance silicone sealing resins have been started to be used in place of conventional epoxy sealing resins. However, even in the case of using a silicone sealing resin, the application of a large current to an LED element particularly for increasing the luminance leads to increases in the temperatures of the LED chip and silicone sealing resin itself. For this reason, there has been a problem that a tackifier contained in the silicone sealing resin and organic components left during the silicone resin synthesis are colored to decrease the luminance.

In contrast, it is known that a metal oxide such as cerium oxide, titanium oxide, or iron oxide is added and blended as a thermal stabilizer in order to improve the heat resistance and ultraviolet light resistance of the silicone resin (see for example, Patent Document 1 and Patent Document 2). However, the effect of coloring prevention has not been confirmed on any organic matters in the silicone resin, other than silicone. In addition, the addition of the metal oxide to the resin material for LED sealing has the problem of decreasing the transparency, thereby leading to a decrease in visible light transmission, and thus resulting in a decrease in luminescent efficiency as an LED device.

CITATION LIST

Patent Literatures

PTL 1: Unexamined Japanese Patent Publication No. 52-14654
PTL 2: Unexamined Japanese Patent Publication No. 2000-21244

SUMMARY OF THE INVENTION

Technical Problem

The present disclosure is intended to solve the conventional problems mentioned above, and provides an LED device which prevents a sealing material from being colored even under high-temperature and high-humidity environment, thereby suppressing a decrease in luminescent efficiency.

Solution to Problem

In order to achieve the object mentioned above, an LED device according to the present disclosure is configured as follows.

The LED device includes: a substrate; an LED element provided on the substrate; a cerium oxide-dispersed composition layer containing cerium oxide in an amount of 0.005 parts by weight or more and 0.03 parts by weight or less with respect to 100 parts by weight of a silicone resin, for covering the LED element; and a sealing material for covering the cerium oxide-dispersed composition layer.

Advantageous Effects of Invention

According to the present disclosure, the LED device in which the cerium oxide-dispersed composition with cerium oxide dispersed therein is provided on the surface of the LED element has the advantageous effect of being able to prevent the sealing material from being colored even under high-temperature and high-humidity environment, and further causes no decrease in transmission.

DESCRIPTION OF EMBODIMENTS

An embodiment of the present invention will be described below.

Figure 1:
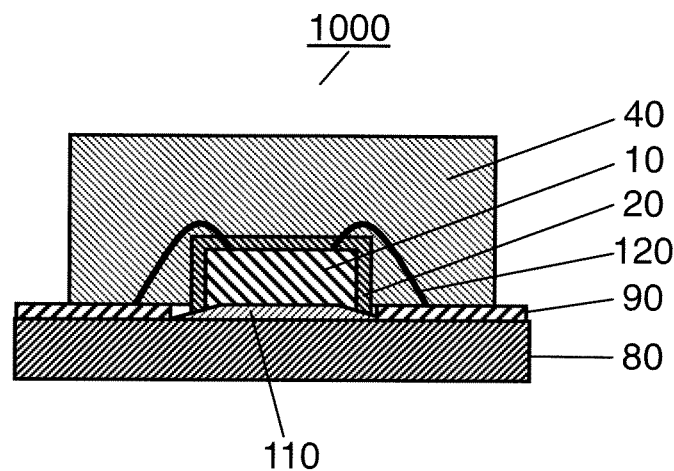
FIG. 1 is a cross-sectional view of an LED device according to the present invention.

LED device 1000 according to the present invention includes, as shown in FIG. 1, substrate 80, LED element 10, color protection material-dispersed composition layer 20 (substantially, cerium oxide-dispersed composition layer), and sealing material 40. Color protection material-dispersed composition layer 20 is a layer composed of a composition with a color protection material dispersed therein, for sealing the surface of LED element 10. LED element 10 is formed on substrate 80. Color protection material-dispersed composition layer 20 is formed so as to cover LED element 10. Sealing material 40 is formed so as to cover color protection material-dispersed composition layer 20. The cerium oxide-dispersed composition layer means color protection material-dispersed composition layer 20 with cerium oxide dispersed in a silicone resin.

A feature of the present invention is that color protection material-dispersed composition layer 20 is provided on the surface of LED element 10. This has the effect of suppressing coloring of the silicone resin.

Further, as shown in FIG. 1, LED element 10 is attached to substrate 80 with die bonding 110. In addition, LED element 10 is connected to electrode 90 with wire bonding 120.

In addition, sealing material 40 is formed so as to cover color protection material-dispersed composition layer 20. Sealing material 40 and substrate 80 (partially electrode 90) seal LED element 10 so as to keep LED element 10 from coming into contact with the external environment (e.g., air).

As the color protection material for the resin, cerium oxide which has the effect of increasing the heat resistance and ultraviolet light resistance of the resin is an optimum material. Furthermore, besides cerium oxide, titanium oxide, iron oxide, and the like can also be used which have effects on the heat resistance and ultraviolet light resistance of the resin.

Sealing material 40 and the cerium oxide-dispersed composition layer contain a silicone resin as their main constituent. The "containing as their main constituent" herein means that the silicone resin accounts for 99.99% or more in sealing material 40 and the cerium oxide-dispersed composition layer.

The silicone resin is a general term for polymers and compounds having a silicon-oxygen bond in their skeletons, and having silicon with one or more hydrocarbon groups. In general, methyl groups may be attached as hydrocarbon groups. For the application of LED packages, a silicone resin with a phenyl group is also used which has a high refractive index.

The silicone resin of sealing material 40 will be described in detail in examples described later.

It is to be noted that the reason to prevent coloring is considered as follows. More specifically, the reason is assumed to be that electrons in the polymer are absorbed by the reduction of cerium ions to render free radicals harmless which are likely to cause oxidation reactions of organic matters other than the resin component, thereby inhibiting the oxidation.

The amount of cerium oxide added to the resin for the prevention of coloring is 0.005 parts by weight or more with respect to 100 parts by weight of the resin. Further, the amount is preferably 0.03 parts by weight or less. An additive amount less than 0.005 parts by weight is less effective in coloring prevention in the evaluation of a light emission test in HAST (Highly Accelerated Stress Test: high-temperature and high-humidity environment at 121° C./RH 85%). An additive amount more than 0.03 parts by weight improves the effect of preventing the resin from being colored, but decreases the visible light transmission.

The cerium oxide-dispersed composition layer preferably has a film thickness from 10 μm to 60 μm, and more preferably from 10 μm to 50 μm. A film thickness below this range is less effective in coloring prevention because of the small amount of cerium oxide. In addition, a film thickness of 60 μm or more decreases the visible light transmission, thereby resulting in a decrease in the luminescent efficiency of the LED device.

The cerium oxide added preferably has a particle size of 200 nm or less. In the case of larger particles above this range, the particles are less effective in coloring prevention, because the particles have a lower probability of coming into contact with the silicone resin when the particles are dispersed in the silicone resin.

The cerium oxide-dispersed composition layer can be obtained by mixing a silicone resin with cerium oxide, and kneading the mixture with the use of a three-roll mill or the like.

The LED device in which the composition with cerium oxide dispersed in the silicone resin is provided on the LED element, with sealing on the cerium oxide-dispersed composition layer, can cause cerium oxide near the LED element heated up to the highest temperature to suppress coloring of organic components. Furthermore, cerium oxide is known to have the effect of suppressing the cross-link decomposition of a resin, and degradation due to the cross-link decomposition of a resin can also be suppressed, because there is cerium oxide around the LED element heated up to the highest temperature.

Due to the thin cerium oxide-dispersed composition layer from 10 μm to 60 μm, the visible light transmission is not decreased, the LED device itself is high in luminescent efficiency, and the LED element can be achieved without coloring the resin. In the case of the cerium oxide dispersed-composition layer of 60 μm or more, or in the case of sealing with sealing material 40 entirely composed of the cerium oxide-dispersed composition, the transmission in the visible light range is decreased at an early stage, and the luminescent efficiency is also decreased.

As the silicone resin, dimethyl silicone or methyl phenyl silicone can be used. In particular, dimethyl silicone is optimum which has high discoloration resistance. In addition, methyl phenyl silicone is inferior in discoloration resistance to dimethyl silicone, but has a feature that cracking is less likely to be caused because of high resistance to cross-link degradation. However, the embodiment according to the present invention is not limited to the above-mentioned types of silicone resins.

The thickness of sealing material 40 is required to be a thickness for sealing the LED element. The sealing material has a thickness of, for example, 0.2 mm or more and 10 mm or less. In this example, the sealing material has a thickness on the order of 4 mm.

In this case, while the type of the LED element is not limited, the sealing material is useful for element sealing, in particular, for blue LEDs, near-ultraviolet LEDs, red LEDs, and green LEDs.

Further, an element may be adopted which has a blue LED converted to a white LED, by mixing cerium oxide and a garnet YAG fluorescent body in the resin, providing a cerium oxide-dispersed composition layer containing a fluorescent body on a blue LED element, and further providing a layer with a fluorescent body in a resin containing no cerium oxide.

EXAMPLES

The present invention will be described specifically with reference to examples. It is to be noted that for transmission evaluation, a silicone resin from 30 μm to 60 μm in film thickness was cured on a glass slide and the transmission at a wavelength of 450 nm was measured. In addition, for a HAST-light emission test, a sealing material of silicone resin was cured on an LED element placed on a substrate, and the LED element was then allowed to emit light under HAST (121° C./RH 85%) environment to compare coloring around the LED element after 900 hours.

Example 1

Figure 2:
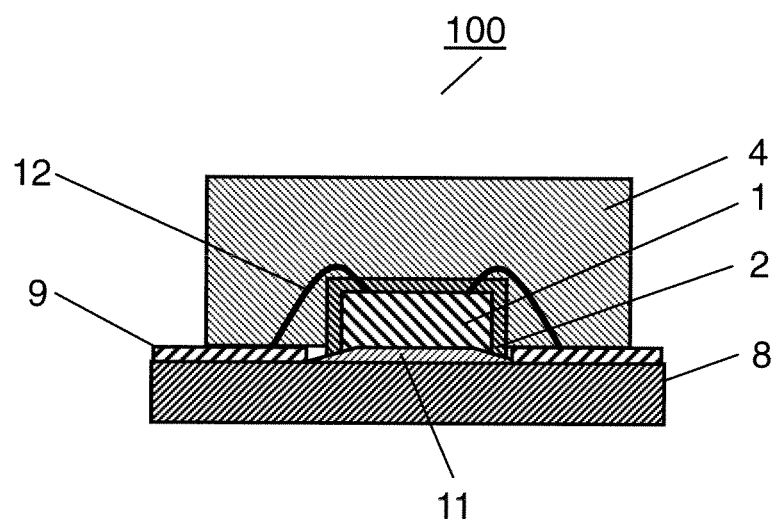
FIG. 2 is a cross-sectional view of an LED device according to Examples 1, 2, and 3 as well as 6 and 7 of the present invention.

FIG. 2 shows a cross-sectional view of LED device 100 according to Example 1. LED device 100 includes substrate 8, LED element 1 attached onto substrate 8 with die bonding 11, electrode 9, wire bonding 12, cerium oxide-dispersed composition layer 2 with cerium oxide dispersed therein, which is provided on the surface of LED element 1, and silicone resin 4 for covering cerium oxide-dispersed composition layer 2. Cerium oxide can function as a color protection material to suppress coloring of silicone resin 4.

The following are a method for manufacturing this LED device 100, as well as a method for preparing an evaluation sample.

First, the method for preparing an evaluation sample of a silicone resin composition will be described.

With the use of a three-roll kneading machine (M50 from EXAKT), 0.0005 g of a cerium oxide powder (average particle size: 36 nm, from Hosokawa Micron Corporation) was kneaded on about three times, into 5 g of an A agent composed of a base compound of a dimethyl silicone resin (KER-2600 from Shin-Etsu Chemical Co., Ltd.) and a catalyst (hereinafter, referred to as an A agent) and 5 g of a B agent composed of the base compound and a curing agent (hereinafter, a B agent) to obtain a cerium oxide-dispersed silicone resin composition. The amount of cerium oxide in this case is 0.005 parts by weight with respect to 100 parts by weight of the silicone resin. This cerium oxide-dispersed composition is printed onto a glass slide. Next, curing at 150° C./4 hours was carried out to obtain an evaluation sample of a cerium oxide-dispersed composition (50 μm in thickness).

Next, the method for manufacturing LED device 100 will be described.

Figure 3A:
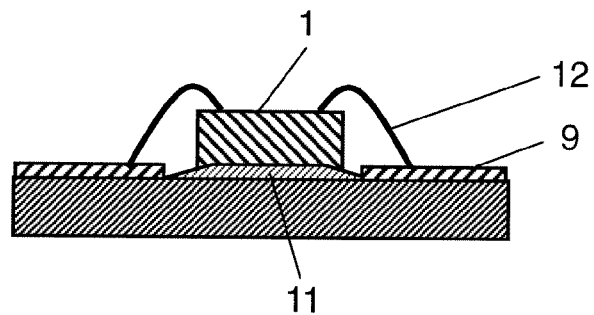
FIG. 3A is a process drawing of a method for manufacturing the LED device according to Examples 1, 2, and 3 as well as 6 and 7 of the present invention.

AlN (aluminum nitride substrate) 8 with copper foil is etched to prepare an electrode pattern. Then, the copper foil section of the electrode pattern is subjected to nickel plating and gold plating to form electrode 9. Then, LED element 1 is bonded onto the substrate with die bonding 11. The electrode section of LED element 1 and electrode section 9 on the substrate are bonded with wire bonding 12 to prepare the configuration shown in FIG. 3A.

Figure 3B:
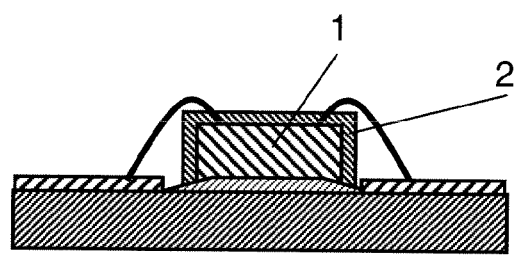
FIG. 3B is a process drawing of the method for manufacturing the LED device according to Examples 1, 2, and 3 as well as 6 and 7 of the present invention.

Next, the cerium oxide-dispersed composition on the order of 30 μm is applied onto the LED element 1. Cerium oxide-dispersed composition layer 2 is subjected to preliminary curing by heating at 150° C. for 15 minutes, thereby preparing the configuration shown in FIG. 3B.

Figure 3C:
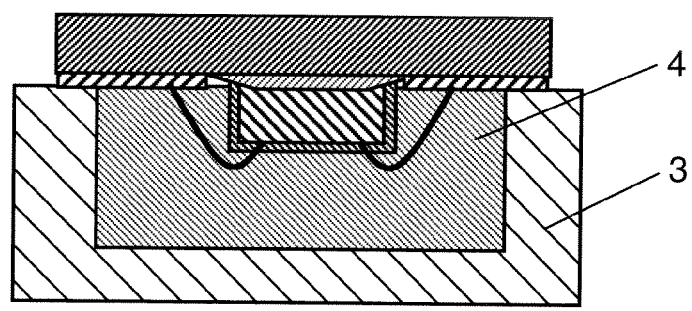
FIG. 3C is a process drawing of the method for manufacturing the LED device according to Examples 1, 2, and 3 as well as 6 and 7 of the present invention.

On the other hand, the silicone resin is prepared by kneading 5 g of the A agent and 5 g of the B agent from the dimethyl silicone resin (KER-2600 from Shin-Etsu Chemical Co., Ltd.) with the use of a kneading machine (AR-250 from Thinky Corporation). Next, the silicone resin is applied onto SUS mold 3. Defoaming is carried out for 5 minutes with the use of a vacuum defoaming device (from NEC ANELVA Corporation) to bond cerium oxide-dispersed composition layer 2 provided on LED element 1 and silicone resin 4 in mold 3 to each other. Next, preliminary curing at 150° C./10 minutes is carried out to prepare the configuration of FIG. 3C. It is to be noted that silicone resin 4 has a thickness of 4 mm. The thickness in this case refers to the thickness in the direction of stacking the respective layers of LED element 1, or in the direction of light emission.

Then, mold 3 was removed, and curing at 150° C./4 hours was further carried out with the cerium oxide-dispersed silicone resin on LED element 1 sealed with the silicone resin thereon, thereby forming LED device 100 as in FIG. 2.

The thus prepared evaluation sample and LED device sample were subjected to the transmission evaluation and coloring evaluation described above. The results are shown in Table 1.

Example 2

Example 2 differs from Example 1 in that the amount of cerium oxide was adjusted to 0.01 parts by weight with respect to 100 parts by weight of the silicone resin, and the other configuration is the same as in Example 1.

Likewise, an evaluation sample and an LED device sample were prepared. The evaluation results are shown in Table 1.

Example 3

Example 3 differs from Example 1 in that the amount of cerium oxide was adjusted to 0.03 parts by weight with respect to 100 parts by weight of the silicone resin, and the other configuration is the same as in Example 1.

Likewise, an evaluation sample and an LED device sample were prepared. The evaluation results are shown in Table 1.

Example 4

Figure 4:
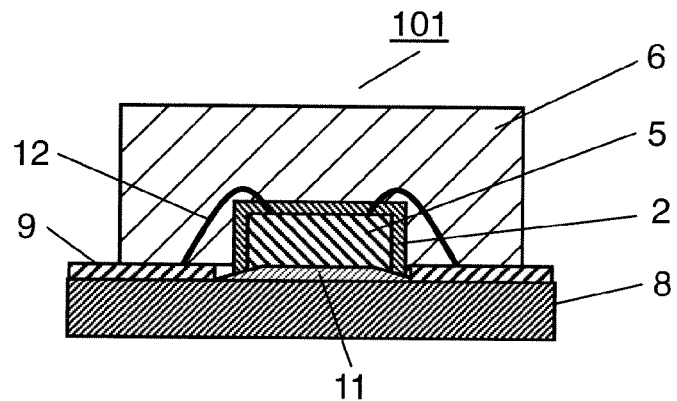
FIG. 4 is a cross-sectional view of an LED device according to Example 4 of the present invention.

FIG. 4 shows a cross-sectional view of LED device 101 according to Example 4. LED device 101 includes substrate 8, blue LED element 5 attached onto substrate 8 with die bonding 11, electrode 9, wire bonding 12, cerium oxide-dispersed composition layer 2 with cerium oxide dispersed therein, which is provided on the surface of blue LED element 5, and fluorescent body-containing silicone resin 6 for covering cerium oxide-dispersed composition layer 2. Cerium oxide can function as a color protection material to suppress coloring of the silicone resin.

The following are a method for manufacturing this LED device 101, as well as a method for preparing an evaluation sample.

First, the method for preparing an evaluation sample will be described.

With the use of a three-roll kneading machine (M50 from EXAKT), 0.0005 g of a cerium oxide powder (average particle size: 36 nm, from Hosokawa Micron Corporation) was kneaded about three times into 5 g of the A agent and 5 g of the B agent from the dimethyl silicone resin (KER-2600 from Shin-Etsu Chemical Co., Ltd.) to obtain a cerium oxide-dispersed silicone resin composition. The amount of cerium oxide in this case is 0.005 parts by weight with respect to 100 parts by weight of the silicone resin. This cerium oxide-dispersed composition is printed onto a glass slide. Next, curing at 150° C./4 hours was carried out to obtain an evaluation sample of a cerium oxide-dispersed composition (30 μm in thickness).

Next, a method for manufacturing LED device 101 will be described.

Figure 5A:
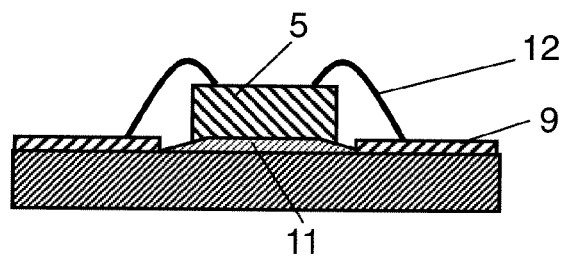
FIG. 5A is a process drawing of a method for manufacturing the LED device according to Example 4 of the present invention.

AlN (aluminum nitride substrate) 8 with copper foil is etched to prepare an electrode pattern. Then, the copper foil section of the electrode pattern is subjected to nickel plating and gold plating to form electrode 9. Then, blue LED element 5 is bonded onto the substrate with die bonding 11. The electrode section of LED element 5 and electrode section 9 on the substrate are bonded with wire bonding 12 to prepare the configuration shown in FIG. 5A.

Figure 5B:
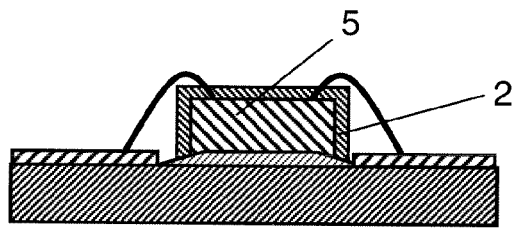
FIG. 5B is a process drawing of the method for manufacturing the LED device according to Example 4 of the present invention.

Next, the cerium oxide-dispersed composition on the order of 30 μm is applied onto blue LED element 5. The cerium oxide-dispersed composition is subjected to preliminary curing by heating at 150° C. for 15 minutes, thereby preparing the configuration shown in FIG. 5B.

Figure 5C:
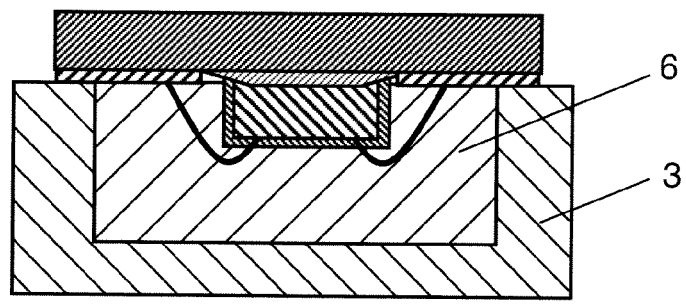
FIG. 5C is a process drawing of the method for manufacturing the LED device according to Example 4 of the present invention.

On the other hand, the silicone resin is prepared by kneading 1 g of a fluorescent body into 5 g of the A agent and 5 g of the B agent from the dimethyl silicone resin (KER-2600 from Shin-Etsu Chemical Co., Ltd.), with the use of a kneading machine (AR-250 from Thinky Corporation). Next, this silicone resin is applied onto SUS mold 3. Defoaming is carried out for 5 minutes with the use of a vacuum defoaming device (from NEC ANELVA Corporation) to bond the cerium oxide dispersed-silicone composition provided on blue LED element 5 and fluorescent body-containing silicone resin 6 in mold 3 to each other. Next, preliminary curing at 150° C./15 minutes is carried out to prepare the configuration of FIG. 5C. It is to be noted that fluorescent body-containing silicone resin 6 has a thickness of 4 mm.

Then, mold 3 was removed, and curing at 150° C./4 hours was further carried out with cerium oxide dispersed-silicone resin 2 on LED element 5 sealed with fluorescent body-containing silicone resin 6 thereon, thereby forming LED device 101 as in FIG. 4.

The thus prepared evaluation sample and LED device sample were subjected to the transmission evaluation and coloring evaluation described above. The results are shown in Table 1.

Example 5

Figure 6:
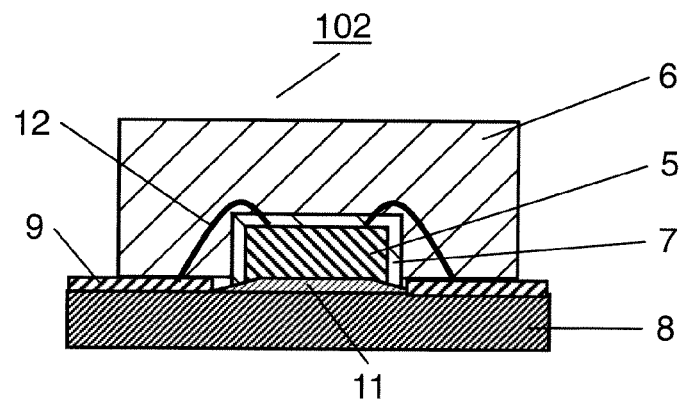
FIG. 6 is a cross-sectional view of an LED device according to Example 5 of the present invention.

FIG. 6 shows a cross-sectional view of LED device 102 according to Example 5. LED device 102 includes substrate 8, blue LED element 5 attached onto substrate 8 with die bonding 11, electrode 9, wire bonding 12, fluorescent body-cerium oxide-dispersed composition layer 7 provided on the surface of blue LED element 5, and fluorescent body-containing silicone resin 6 for covering fluorescent body-cerium oxide-dispersed composition layer 7. Cerium oxide can function as a color protection material to suppress coloring of the silicone resin.

The following are a method for manufacturing this LED device 102, as well as a method for preparing an evaluation sample.

First, the method for preparing an evaluation sample will be described.

With the use of a three-roll kneading machine (M50 from EXAKT), 5 g of the A agent and 5 g of the B agent from the dimethyl silicone resin (KER-2600 from Shin-Etsu Chemical Co., Ltd.) with and without 0.001 g of a cerium oxide powder (average particle size: 36 nm, from Hosokawa Micron Corporation) and 1 g of a YAG fluorescent body were kneaded about three times to obtain a fluorescent body-cerium oxide-dispersed composition and a cerium oxide-dispersed composition. The amount of cerium oxide in this case is 0.01 parts by weight with respect to 100 parts by weight of the silicone resin. For the evaluation samples, this cerium oxide-dispersed composition is printed onto a glass slide. Next, curing at 150° C./4 hours was carried out to obtain an evaluation sample of a cerium oxide-dispersed composition (30 μm in thickness).

Next, a method for manufacturing LED device 102 will be described.

Figure 7A:
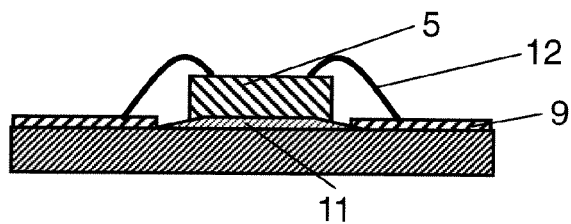
FIG. 7A is a process drawing of a method for manufacturing the LED device according to Example 5 of the present invention.

AlN (aluminum nitride substrate) 8 with copper foil is etched to prepare an electrode pattern. Then, the copper foil section of the electrode pattern is subjected to nickel plating and gold plating to form electrode 9. Then, blue LED element 5 is bonded onto the substrate with die bonding 11. The electrode section of the LED element and electrode section 9 on the substrate are bonded with wire bonding 12 to prepare the configuration shown in FIG. 7A.

Figure 7B:
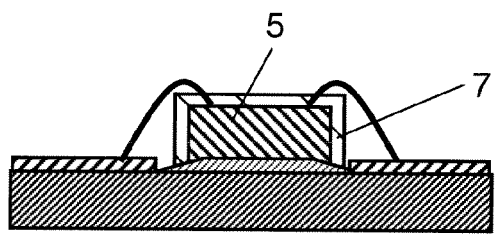
FIG. 7B is a process drawing of the method for manufacturing the LED device according to Example 5 of the present invention.

Next, the fluorescent body-cerium oxide-dispersed composition on the order of 30 μm is applied onto blue LED element 5. Fluorescent body-cerium oxide-dispersed composition layer 7 is subjected to preliminary curing by heating at 150° C. for 15 minutes, thereby preparing the configuration shown in FIG. 7B.

Figure 7C:
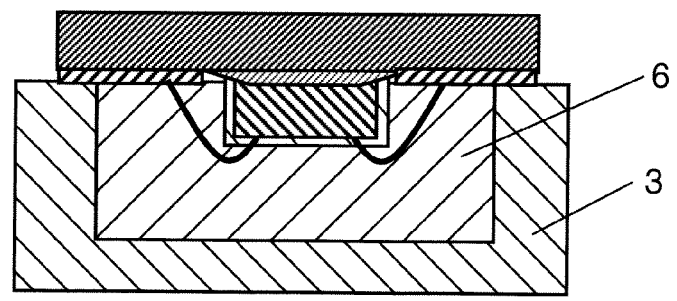
FIG. 7C is a process drawing of the method for manufacturing the LED device according to Example 5 of the present invention.

On the other hand, the silicone resin is prepared by kneading 1 g of a fluorescent body into 5 g of the A agent and 5 g of the B agent from the dimethyl silicone resin (KER-2600 from Shin-Etsu Chemical Co., Ltd.), with the use of a kneading machine (AR-250 from Thinky Corporation). Next, this silicone resin is applied onto SUS mold 3. Defoaming is carried out for 5 minutes with the use of a vacuum defoaming device (from NEC ANELVA Corporation) to bond the fluorescent body-cerium oxide-dispersed composition provided on blue LED element 5 and silicone resin 6 in mold 3 to each other. Next, preliminary curing at 150° C./15 minutes is carried out to prepare the configuration of FIG. 7C. It is to be noted that fluorescent body-containing silicone resin 6 has a thickness of 4 mm.

Then, mold 3 was removed, and curing at 150° C./4 hours was further carried out with fluorescent body-cerium dispersed composition 7 on LED element 5 sealed with fluorescent body-containing silicone resin 6 thereon, thereby forming LED device 102 as in FIG. 6.

The thus prepared evaluation sample and LED device sample were subjected to the transmission evaluation and coloring evaluation described above. The results are shown in Table 1.

Example 6

Example 6 differs from Example 1 in that the amount of cerium oxide was adjusted to 0.05 parts by weight with respect to 100 parts by weight of the silicone resin, and the other configuration is the same as in Example 1.

Likewise, an evaluation sample and an LED device sample were prepared. The evaluation results are shown in Table 1.

Example 7

Example 7 differs from Example 1 in that the amount of cerium oxide was adjusted to 0.01 parts by weight with respect to 100 parts by weight of the silicone resin, and that the thickness of the cerium oxide-dispersed composition layer was adjusted to 60 and the other configuration is the same as in Example 1. Likewise, an evaluation sample and an LED device sample were prepared. The evaluation results are shown in Table 1.

Comparative Example 1

Comparative Example 1 differs from Example 1 in that the amount of cerium oxide was adjusted to 0.001 parts by weight with respect to 100 parts by weight of the silicone resin, and the other configuration is the same as in Example 1.

Likewise, an evaluation sample and an LED device sample were prepared. The evaluation results are shown in Table 1.

Comparative Example 2

Figure 8:
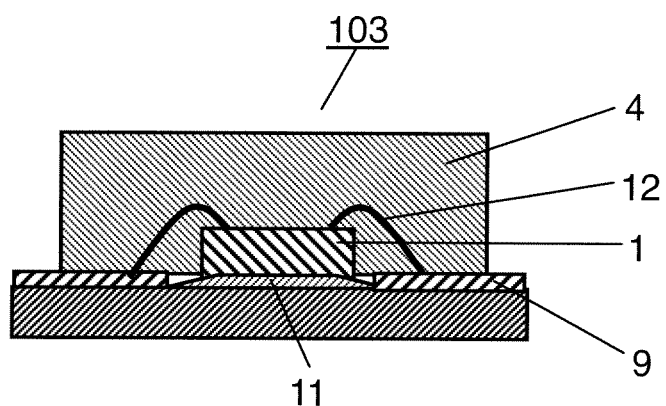
FIG. 8 is a cross-sectional view of an LED device according to Comparative Example 2.

FIG. 8 shows a cross-sectional view of LED device 103 according to Comparative Example 2. LED device 103 includes substrate 8, LED element 1 attached onto substrate 8 with die bonding 11, electrode 9, wire bonding 12, and silicone resin 4. Comparative Example 2 differs from Example 1 in that there is no sealing with the cerium oxide-dispersed composition on LED element 1, and the other configuration is the same as in Example 1. Likewise, an evaluation sample and an LED device sample were prepared. The evaluation results are shown in Table 1.

In the case of the LED device with 0.001 parts by weight of the cerium oxide powder mixed in the silicone resin according to Comparative Example 1, coloring is caused after 900 hours in the HAST-light emission test, because of the small amount of cerium oxide for preventing the coloring.

On the other hand, in Examples 1 to 3 with 0.005 to 0.03 parts by weight of cerium oxide mixed in the silicone resin

TABLE 1

| Experiment | Composition of Cerium Oxide-Dispersed Composition Layer | Film Thickness of Cerium Oxide-Dispersed Layer | Transmission Evaluation | HAST - Light Emission Evaluation |
|---|---|---|---|---|
| Comparative Example 1 | Silicone Resin + Cerium Oxide Powder (0.001 parts by weight of cerium oxide) | 30 μm | 99.9% | Colored |
| Example 1 | Silicone Resin + Cerium Oxide Powder (0.005 parts by weight of cerium oxide) | 30 μm | 99.7% | Not Colored |
| Example 2 | Silicone Resin + Cerium Oxide Powder (0.01 parts by weight of cerium oxide) | 30 μm | 99.4% | Not Colored |
| Example 3 | Silicone Resin + Cerium Oxide Powder (0.03 parts by weight of cerium oxide) | 30 μm | 99.0% | Not Colored |
| Example 4 | Silicone Resin + Cerium Oxide Powder + Fluorescent Body (0.005 parts by weight of cerium oxide) | 30 μm | 99.7% | Not Colored |
| Example 5 | Silicone Resin + Cerium Oxide Powder + Fluorescent Body (0.01 parts by weight of cerium oxide) | 30 μm | 99.4% | Not Colored |
| Example 6 | Silicone Resin + Cerium Oxide Powder (0.05 parts by weight of cerium oxide) | 30 μm | 97.6% | Not Colored |
| Example 7 | Silicone Resin + Cerium Oxide Powder (0.01 parts by weight of cerium oxide) | 60 μm | 98.2% | Not Colored |
| Comparative Example 2 | Only Silicone Resin | 30 μm | 100% | Colored |

As shown in Table 1, in the case of the LED device with only the silicone resin for sealing according to Comparative Example 2, organic matters in the silicone resin, other than silicone, are colored after 900 hours in the HAST-light emission test.

In the case of the LED device with 0.05 parts by weight of the cerium oxide powder mixed in the silicone resin according to Example 6, no coloring is caused after 900 hours in the HAST-light emission test, while the transmission at an early stage is 97.6%, which is somewhat low because of the large amount of cerium oxide.

In the case of the LED device with 0.01 parts by weight of the cerium oxide powder mixed in the silicone resin according to Example 7, no coloring is caused after 900 hours in the HAST-light emission test, while the transmission at an early stage is 98.2%, which is somewhat low because of the large film thickness of the cured product of the cerium oxide-dispersed silicone resin composition.

according to the present invention, no coloring is caused after 900 hours in the HAST-light emission test, and no decrease is observed in luminescent efficiency after the test. Furthermore, the initial transmission is also 99% or more, and the emission intensity thus has no problem found. Also in the system using the fluorescent body as in Examples 4 and 5, a similar effect is produced.

Although the value at 450 nm is determined as the transmission, the transmission is not significantly decreased even at a wavelength of 400 nm for a near-ultraviolet LED, and thus, a similar effect is produced even in the case of other LED elements such as a near-ultraviolet LED.

INDUSTRIAL APPLICABILITY

In the structure according to the present invention, which has the cerium oxide-dispersed composition layer provided on the LED element, and further has the sealing material provided thereon, the silicone resin is not colored, and the structure is thus useful as an LED device with no decrease in luminescent efficiency.

| REFERENCE SIGNS LIST | |
|---|---|
| 1, 10 | LED element |
| 2 | cerium oxide-dispersed composition layer |
| 3 | mold |
| 4 | silicone resin |
| 5 | blue LED element |
| 6 | florescent body-containing silicone resin |
| 7 | fluorescent body-cerium oxide-dispersed composition layer |
| 8, 80 | substrate |
| 9, 90 | electrode |
| 11, 110 | die bonding |
| 12, 120 | wire bonding |
| 20 | color protection material-dispersed composition layer |
| 40 | sealing material |
| 100, 101, 102, 103, 1000 | LED device |

The invention claimed is:

1. An LED device comprising:
a substrate;
an LED element provided on the substrate;
a cerium oxide-dispersed composition layer containing a silicone resin and cerium oxide in an amount of 0.005 parts by weight or more and 0.03 parts by weight or less with respect to 100 parts by weight of the silicone resin, and having a thickness of 10 μm or more and 60 μm or less, the cerium oxide-dispersed composition layer covering the LED element; and
a sealing material containing no cerium oxide, containing a silicone resin as its main constituent, and covering the cerium oxide-dispersed composition layer for sealing the LED element.

2. The LED device according to claim 1, wherein the sealing material comprises a fluorescent material.

3. The LED device according to claim 2, wherein the LED element is a blue LED.

4. A method for manufacturing an LED device, the method comprising steps of:
providing an LED element on a substrate;
covering the LED element with a cerium oxide-dispersed composition layer containing a silicone resin and cerium oxide in an amount of 0.005 parts by weight or more and 0.03 parts by weight or less with respect to 100 parts by weight of the silicone resin, and having a thickness of 10 μm or more and 60 μm or less; and
covering the cerium oxide-dispersed composition layer with a sealing material containing no cerium oxide and containing a silicone resin as its main constituent, for sealing the LED element.

5. The LED device according to claim 1, further comprising:
an electrode disposed on the substrate; and
a wire connecting the LED element and the electrode, wherein:
the wire protrudes from the cerium oxide-dispersed composition layer, and is sealed by the sealing material.

6. The LED device according to claim 1, wherein the cerium oxide is in a form of particles having an average diameter of 200 nm or less.

* * * * *